United States Patent [19]
Sakata et al.

[11] Patent Number: 5,284,791
[45] Date of Patent: Feb. 8, 1994

[54] METHOD OF MAKING TUNABLE SEMICONDUCTOR LASER

[75] Inventors: Yasutaka Sakata; Masayuki Yamaguchi; Tatsuya Sasaki, all of Tokyo, Japan

[73] Assignee: NEC Corporation, Tokyo, Japan

[21] Appl. No.: 926,240

[22] Filed: Aug. 6, 1992

[30] Foreign Application Priority Data

Aug. 9, 1991 [JP] Japan .................................. 3-224763
Jan. 10, 1992 [JP] Japan .................................. 4-022040

[51] Int. Cl.$^5$ .......................................... H01L 21/20
[52] U.S. Cl. .................................. 437/129; 437/126; 437/133; 148/DIG. 95; 148/DIG. 110
[58] Field of Search ................. 437/129, 133, 126; 148/DIG. 95, DIG. 110; 372/46, 45

[56] References Cited

U.S. PATENT DOCUMENTS

| | | | |
|---|---|---|---|
| 4,213,805 | 7/1980 | Tsukada | 437/129 |
| 4,852,110 | 7/1989 | Fujii et al. | 372/46 |
| 4,940,672 | 7/1990 | Zavracky | 148/DIG. 95 |
| 4,949,350 | 8/1990 | Jewell et al. | 372/46 |
| 4,950,622 | 8/1990 | Kwon et al. | 437/89 |
| 5,008,893 | 4/1991 | Amann et al. | 372/46 |
| 5,070,510 | 12/1991 | Konushi et al. | 372/46 |

FOREIGN PATENT DOCUMENTS

| | | | |
|---|---|---|---|
| 52-76890 | 6/1977 | Japan | 437/133 |
| 4-105383 | 4/1992 | Japan | 372/45 |

Primary Examiner—Tom Thomas
Assistant Examiner—Michael Trinh
Attorney, Agent, or Firm—Laff, Whitesel, Conte & Saret

[57] ABSTRACT

In a method of making a tunable twin guide (TTG) type tunable semiconductor laser, over the surface of a semiconductor substrate of one conductivity type, an active layer, a central layer of the opposite conductivity type, and a tuning layer, each being stripe-shaped and overlying the top of the preceding one is provided. This method is characterized in that the processing of semiconductor elements for defining the current path/optical waveguide inside the laser is carried out not by etching but by using selective epitaxy method such as metal organic vapor phase epitaxy (MOVPE). The use of selective MOVPE permits to form stripe-shaped layers at high precision and good uniformity, with consequent effects of minimizing scattering of laser light, increasing the efficiency of the drive power to laser light output conversion and enhancing the coupling efficiency with optical fibers. Besides thinner central layer that can be formed can contributes to enlarging the tunable bandwidth of laser light.

1 Claim, 6 Drawing Sheets

METHOD OF MAKING TUNABLE SEMICONDUCTOR LASER

BACKGROUND OF THE INVENTION

1. Field of the Invention

This invention relates to a method of making a tunable semiconductor laser capable of controlling the wavelength of the coherent light to be output.

2. Description of the Prior Art

The tunable semiconductor lasers is used as a local oscillation light source for receiving in coherent light communications systems, and also as a carrier-wave light source of frequency-division multiplex light transmitter. Not only for increasing channel capacity in optical communications systems but also for enabling longer distance between communication relay stations by longer transmittable distance, it is necessary to improve the performance of the semiconductor laser which is a major component. Effect is being devoted to the development for this.

Tunable lasers proposed so far are of different types such as distributed feedback (DFB) type, distributed Bragg Reflector (DBR) type, and tunable twin guide (TTG) type. DFB type and DBR type of these conventional tunable semiconductor lasers are described, for example, in U.S. Pat. No. 4,949,350 issued on Aug. 14, 1990, and hence the detail of these is omitted herein.

A typical example of TTG tunable semiconductor laser is described in U.S. Pat. No. 5,480,049 issued on Sep. 10, 1991 which is made by the following process: On the surface of a p-type indium phosphide (InP) substrate is a layer sequence consisting of a 2 $\mu$m-thick buffer layer of the same material, a 0.15 $\mu$m-thick diffraction grating layer of p-type indium gallium arsenide phosphide (InGaAsP), an n-type InGaAsP active layer of 0.1 $\mu$m thick, a 0.05 $\mu$m-thick antimelt-back layer of InGaAsP, a n-type InP central layer of 0.1 $\mu$m thick, a n-type InGaAsP tuning layer of 3 $\mu$m thick, a p-type InP cover layer of 1.5 $\mu$m thick, and a InGaAsP contact layer of 0.2 $\mu$m thick. These are grown by the liquid phase epitaxy technique each on the top of the preceding one. Then the layer sequence is etched to leave a stripe-shaped mesa having a predetermined width. The remaining where etched away is filled as lateral n-type InP regions. The periphery of the lateral regions is inactivated by proton implantation or p-type impurity diffusion. Then each of conducting films insulated from each other is applied by the usual patterning onto the surfaces of the p-type InP substrate, the contact layer, and the lateral regions, respectively, and connected to a laser oscillation drive power input electrode, a tuning power input electrode, and a common lateral layer electrode, respectively. Electric current injection of charge carriers (holes and electrons) bringing about laser oscillation reaches the common electrode from the laser oscillation drive power input electrode via the conductor layer on the substrate undersurface, substrate, barrier layer, diffraction grating layer, active layer, and lateral regions. On the other hand, the current injection for tuning reaches the common electrode from the tunable power input electrode via the cover, tuning, and lateral regions.

A TTG tunable semiconductor laser achieving independent definition of the current path and optical waveguide, respectively, by different means is described in U.S. Pat. No. 5,008,893 issued on Apr. 16, 1991, and its manufacturing process is summarized as follows: On the surface of a p-type InP substrate of 80 $\mu$m thick, a multilayer structure consisting of a 5 $\mu$m thick buffer layer of the same material, a 0.15 $\mu$m-thick barrier layer composed of three layers of n-type InGaAsP, n-type InP and p-type InP are formed sequencially. Then a part of the multilayer structure is etched away in stripe form corresponding to the current path for supply of carriers for laser oscillation. A 1 $\mu$m-thick compensating layer of p-type InP is formed over the overall surface in addition to filling the etched part with the same material, and thereon an active layer of InGaAsP is formed. After applying a 0.03 $\mu$m-thick protective film of InGaAsP onto this active layer, an n-type InP central layer of 0.15 $\mu$m thick, and an n-type InGaAsP tuning layer of 0.2 $\mu$m thick are formed. After forming the first contact layer of n-type InGaAsP of 0.1 $\mu$m thick on the entire surface of the tuning layer, a p-type InP cladding layer of 1.5 $\mu$m thick and the second contact layer of p-type InGaAsP of 0.2 $\mu$m thick are formed. Then the first etching is carried out to remove a part of the periphery of the multilayer structure including from the second contact layer to the active layer to form an edge parallel to the stripes. Then the second etching is carried out to leave a part of the multilayer structure from the second contact layer to the cladding layer to be a ridge waveguide having the same form as the stripe of the current path and to remove the remaining part. Subsequently to the substrate undersurface, and the first and second contact layers, respectively, are connected each of a laser oscillation drive power input electrode, common electrode, and tunable power input electrode. In the TTG tunable semiconductor laser with this ridge waveguide, current for carrier injection bringing about laser oscillation reaches the common electrode from the laser oscillation drive power input electrode through the compensating layer filling the stripe-shaped window in the barrier layer, the active layer and the central layer. On the other hand, the current for carrier injection for tuning reaches the common electrode from the tuning power input electrode through the cladding, and tuning layers.

As apparent from the above-described structure, the TTG tunable semiconductor laser is tunable through variation of the refractive index which can caused by carrier injection from the wavelength control electrode under the condition of single mode oscillation kept by carrier injection from the laser oscillation drive electrode and in turn. The change in refractive index of the tuning layer which varies laser oscillation wavelength is due to production of plasma in the layer resulting from the carrier injection. The tuning efficiency of the TTG laser is dependent on how much carriers are enclosed into the tuning layer and on what extent the laser oscillation light and the tuning layer interact.

The above-described process of manufacturing TTG laser includes a processing step of building a striped-shaped mesa or a waveguide ridge by selective etching of the multilayer structure as described above, and therefore these geometries vary considerably with the temperature, concentration, and agitation of the etchant used in this step. In other words, progress of etching varies finely with site of the multilayer structure and variable processing time, and this makes it difficult to ensure the geometrical uniformity of the stripe-shaped mesa or waveguide ridge. Further the variation in progress in etching causes geometrical disorder of stripe-shaped mesa and waveguide ridge, which in turn results in scattering of laser light, loss of laser light output, and lowered efficiency of the current to laser light conversion. Besides the scattering of laser light reduces the coupling efficiency between the semiconductor laser light and an optical fiber constituting optical light transmission path.

SUMMARY OF THE INVENTION

It is therefore an object of the present invention to provide a method of making a tunable semiconductor laser of the above-mentioned type comprising a processing step of semiconductor elements for defining current path or optical waveguide inside the tunable semiconductor laser without using etching.

The process of for making the tunable semiconductor laser according to the present invention comprises steps of selective growth method such as metal organic vapor phase epitaxy (MOVPE) instead of etchings as described for forming the above-mentioned multilayer structure.

The manufacturing method according to the present invention forms the above-described TTG structure by selective MOVPE instead of using etching technique, and thereby realization of the stripe structure at high precision and in good uniformity is possible. Besides it enables to form thinner layer between the active layer and the tuning layer, contributing to wider tunable bandwidth of laser light.

DESCRIPTION OF THE PREFERRED EMBODIMENTS

Figure 1A:
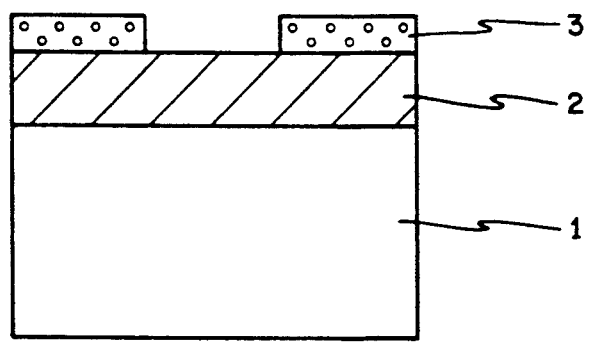
FIGS. 1(a) through 1(c) and FIGS. 2(a) through 2(c) are sectional views illustrating in sequence the processing steps of the first embodiment of the present invention.
Figure 1B:
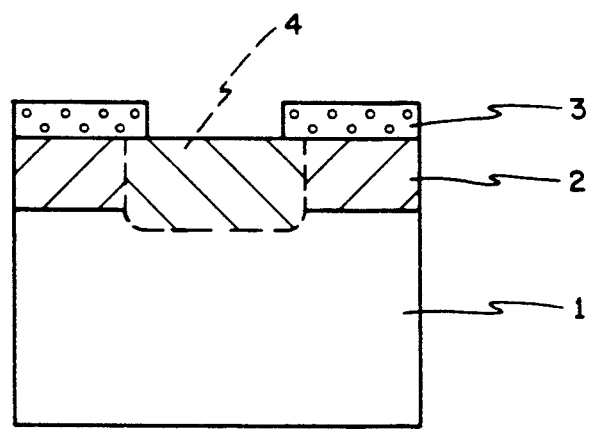
Figure 1C:
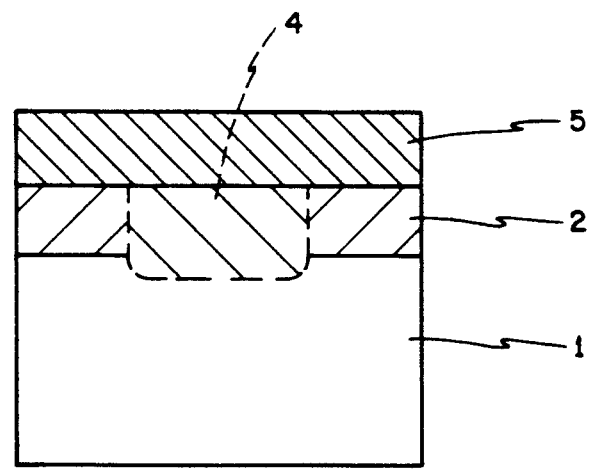

The first embodiment of the present invention as process used in fabricating a 1.5 $\mu$m band TTG semiconductor laser will be set forth with reference FIGS. 1(a) through 1(c), FIG. 2(a) through 2(c) and FIG. 3 illustrating in sequence the processing steps of it. Over the entire surface of a p-type InP substrate, a 1 $\mu$m-thick n-type InP layer 2 is grown to a carrier concentration of $2\times10^{17}$ cm$^{-3}$ by MOVPE, and thereon a stripe mask 3 of SiO$_2$ provided with a stripe-shaped window of 3 $\mu$m wide is formed (FIG. 1(a)). Then selective diffusion of Zn is carried out through mask 3, thereby the exposed region being inverted with respect to type of conductivity to form a p-type InP region 4 (FIG. 1(b)). After removing mask 3, a 1 $\mu$m-thick p-type InP layer 5 is grown over the whole surface to a p-carrier concentration of $7\times10^{17}$ cm$^{-3}$ (FIG. 1(c)).

After providing a diffraction grating (not shown) on the surface of p-type InP layer 5, a mask 21 of SiO$_2$ provided with a 2.0 $\mu$m wide window is formed. On the exposed surface of p-type InP layer 5 through this window, multilayer structure is formed by using selective MOVPE. That is, each on the top of the preceding one, a 0.25 $\mu$m-thick InGaAsP tuning layer 22, a 0.1 $\mu$m-thick central layer 23 of n-type InP ($4\times10^{18}$ cm$^{-3}$ in carrier concentration), an active layer 24, and a 0.2 $\mu$m-thick p-type InP layer 25 are sequentially grown (FIG. 2(a)). Active layer 24 is constructed of a 100 Å-thick InGaAsP layer, a seven-period multi-quantum well structure (which consists of a 70 Å-thick InGaAsP layer and a 100 Å-thick InGaAsP layer), and a 500 Å-thick InGaAsP layer. After removing mask 21, and covering p-type InP layer 25 with a SiO$_2$ film 26 formed on the surface of it, n-type InP is grown over the whole surface of InP layer 5 on the sides of the multilayer ridge 22 to 25, thereby a compensating contact layer of 0.7 $\mu$m thick being formed (FIG. 2(b)). Besides after removing mask 26, using a stripe mask 28 of SiO$_2$ having a window of 6 $\mu$m wide, a 1.5 $\mu$m-thick p-type InP cladding layer 29 and a 0.1 $\mu$m-thick p$^+$-type InGaAs cap layer 30 are grown directly on the multilayer ridge by using selective MOVPE (FIG. 2(c)).

Figure 3:
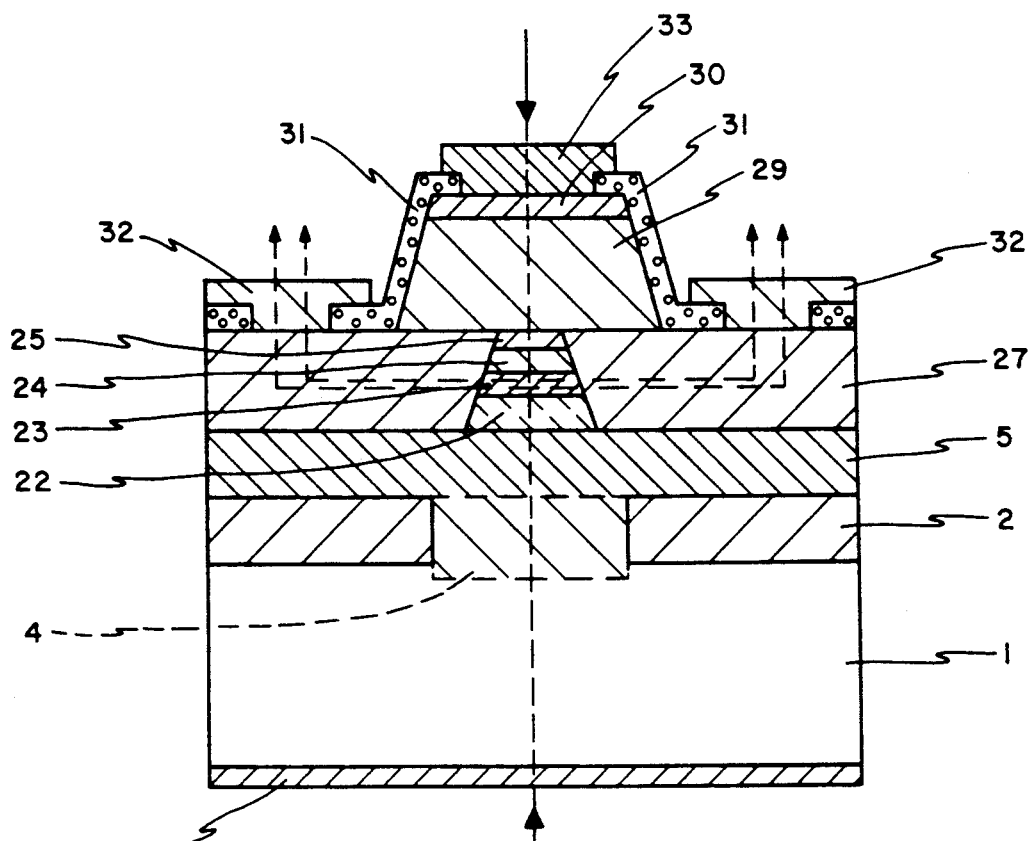
FIG. 3 is a sectional view of the TTG semiconductor laser manufactured by the first embodiment of the present invention.

After forming SiO$_2$ film 31 covering the whole resulting exposed surface including the sides of the cladding layer 29, and the surfaces of a cap layer 30 and a compensating contact layer 27, metal film is formed by patterning on layers 27, 30 as anode 33 and cathode 32, respectively. Similarly on the undersurface of substrate 1, a conductor film is formed as another anode 33 (FIG. 3).

In the tunable semiconductor laser (FIG. 3) manufactured in this embodiment, the drive current bringing about the carrier injection for laser oscillation excitation flows from the anode 33 through the cap layer 30, cladding layer 29, p-type InP layer 25, an active layer 24 including a quantum well structure, a central layer 23, and a compensating contact layer 27 to a common cathode electrode 32. On the other hand, tuning current causing the carrier injection for controlling the refractive index of the tuning layer 22 reaches a common electrode 32 through the aforesaid layers 1, 4, 5, 22, 23 and 27. These current paths are indicated by dashed lines in FIG. 3.

Figure 4A:
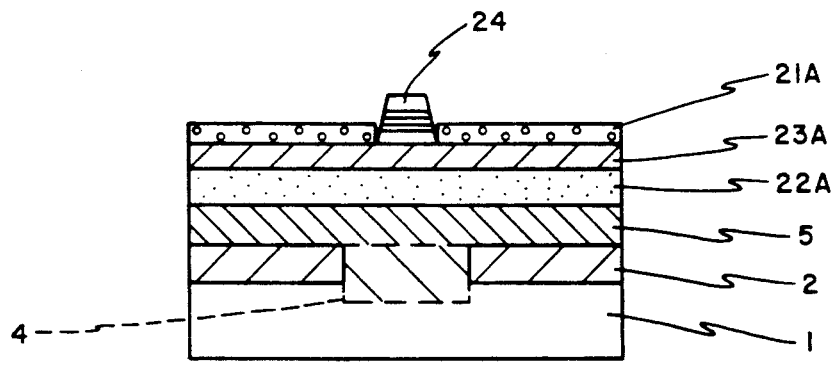
FIGS. 4(a) through 4(c) are sectional views correspondent to FIGS. 2(a) through 2(c), which illustrate in sequence the processing steps of a modified form of the first embodiment of the present invention.
Figure 4B:
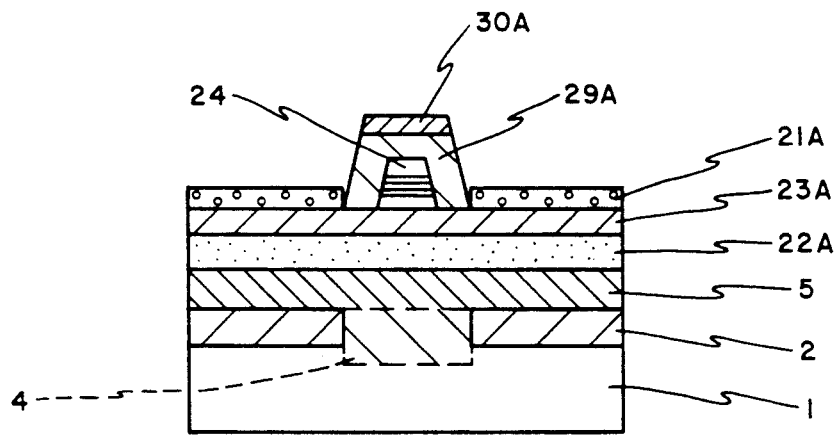
Figure 4C:
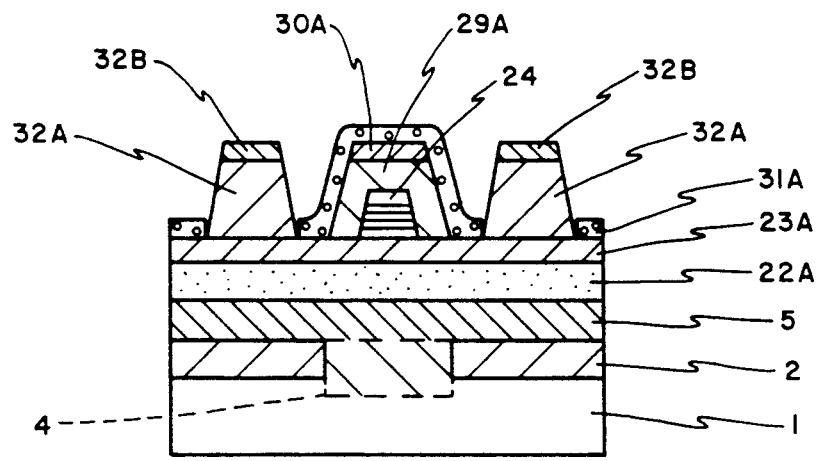

In stead of the tuning layer 22 and the central layer 23 of the multilayer ridge 22 to 25 in the first embodiment described above, as formed by selective growth, layers 22A,23A covering the whole surface of the p-type InP layer 5 can be grown by using MOVPE (FIG. 4(a)). In this case SiO$_2$ film 21A provided with a stripe-shaped window having a width smaller than 2 $\mu$m is formed on the surface of the central layer 23A, and then an active layer 24 is formed by using the selective MOVPE on the surface 23A exposed through the window. After enlarging the width of the stripe window in a mask 21A to 6 $\mu$m, a cladding layer 29A and a cap layer 30A are selectively grown (FIG. 4(b)). After covering the surface of the cladding layer 29A, cap layer 30A and a part of the central layer 23A with a mask 31A, a contact layer 32A and a cap layer 32B are formed by using selective MOVPE (FIG. 4(c)). The cap layer 30A, the cap layer 32B, and the conductor film (not shown) on the undersurface of the substrate 1 (FIG. 4) correspond to the cap layer 30, and the electrodes 32 and 33, respectively, of the above-described first embodiment.

The tunable semiconductor laser according to this embodiment recorded 20 mA as excitation current threshold for generating laser oscillation and 15 mW or more as laser light output power. Besides it has been demonstrated the oscillation wavelength to be continuously variable within the range of up to 85 Å under the condition of laser light output kept at more than 10 mW, and the spectral linewidth was within up to 10 MHz within the same wavelength range.

Figure 2A:
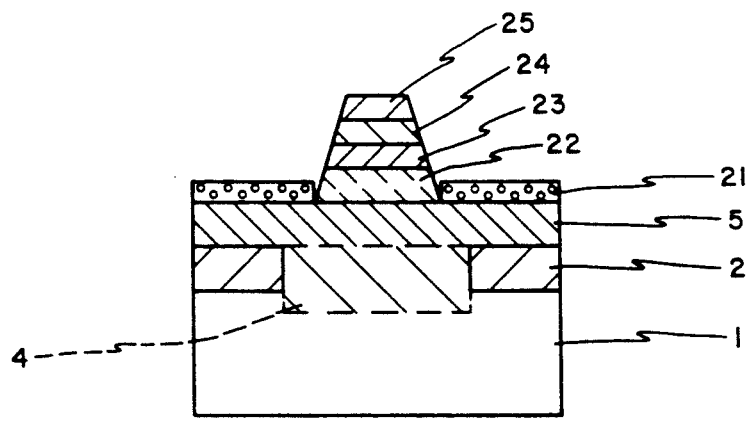
Figure 2B:
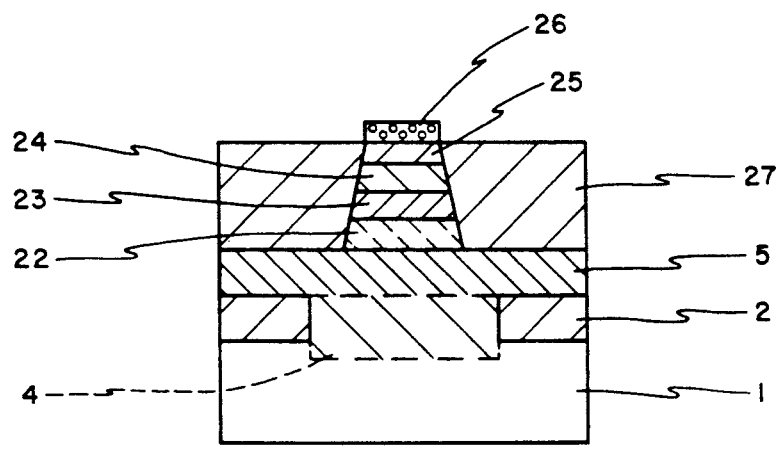
Figure 2C:
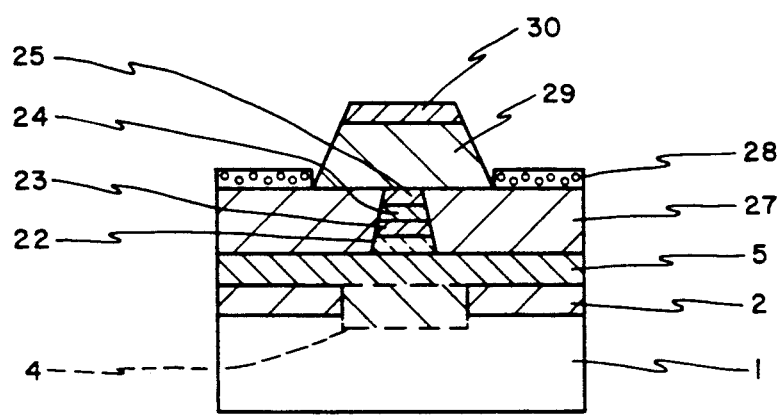

The second embodiment of the present invention will be described with reference to FIGS. 5(a) through 5(d) illustrating in sequence the processing steps like FIGS. 2(a) through 2(c). On the surface of a p-type InP substrate 70, a diffraction grating (not shown) is formed, and then a mask 71 of $SiO_2$ provided with a stripe-shaped window of 2 μm wide is formed. On the surface of a p-type InP substrate 70 exposed through this window, the multi-layer structure is formed by using selective MOVPE, i.e., a 0.25 μm-thick InGaAsP tuning layer 72, a 0.1 μm-thick central layer 73 of n-type InP ($4 \times 10^{18}$ cm$^{-3}$ in carrier concentration), an active layer 74, and a 0.82 μm-thick p-type InP layer 75. The active layer 74 is constructed of a 100 Å-thick InGaAsP layer, a seven-period multi-quantum well structure (which consists of a 70 Å-thick InGaAsP layer and a 100 Å-thick InGaAsP layer), and a 500 Å-thick InGaAsP layer. The above-mentioned thicknesses of those layers cause disappearance of (111) B plane of layer, and in turn result in a pyramid configuration of the multilayer ridge 72 to 75 (FIG. 5(a)). After removing mask 71, a 0.7 μm-thick n-type InP layer 76 is formed over the whole upper surface of substrate 70 and the side of the pyramid (FIG. 5(b)). Subsequently the entire surface of the layer 76 is etched with a sulfuric acid-containing etchant, resulting in removing the top portion of p-type InP layer 75 (FIG. 5(c)). After bringing a mask 77 provide with a 6 μm-wide, stripe-shaped $SiO_2$ window correspondent in area to the multilayer ridge, on the surface of n-type InP layer 76 exposed through this window, a 1.5 μm-thick p-type InP cladding layer 78 and a 0.1 μm-thick p-type InGaAs cap layer 79 are formed by using selective MOVPE (FIG. 4(d)).

Figure 6:
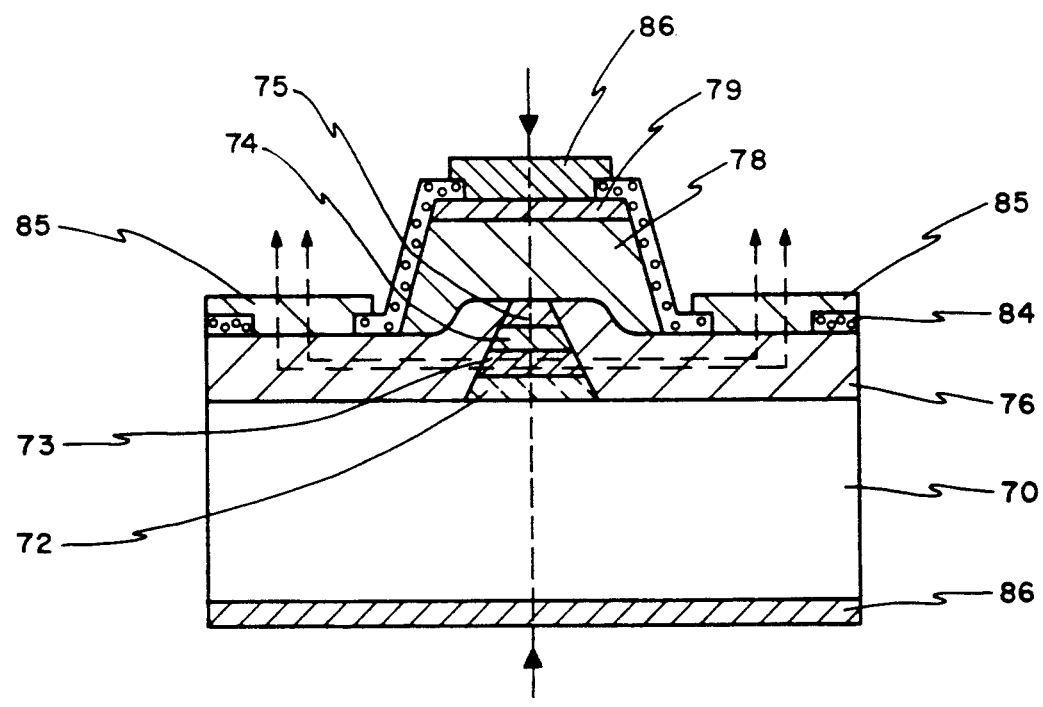
FIG. 6 is a sectional view of the TTG semiconductor laser manufactured by the second embodiment of the present invention.

Additionally referring to FIG. 6, after forming $SiO_2$ film 84 over, and covering the sides of the cladding layer 78, cap layer 79, and compensating contact layer 76, a metal film is formed by patterning on layers 79 and 76 as an anode 86 and a cathode 85, respectively. On the undersurface of the substrate 70, another conductor film is formed as another anode 86.

Figure 5A:
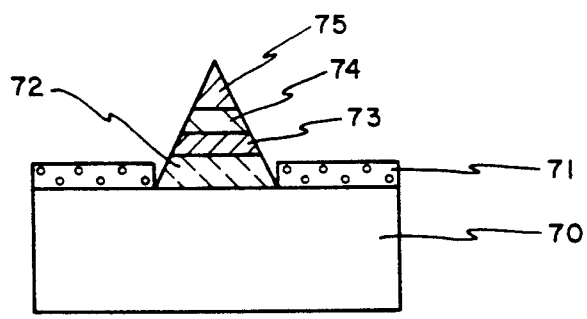
FIGS. 5(a) through 5(d) are sectional views correspondent to FIGS. 2(a) through 2(c), which illustrate in sequence the processing steps of the second embodiment of the present invention.
Figure 5B:
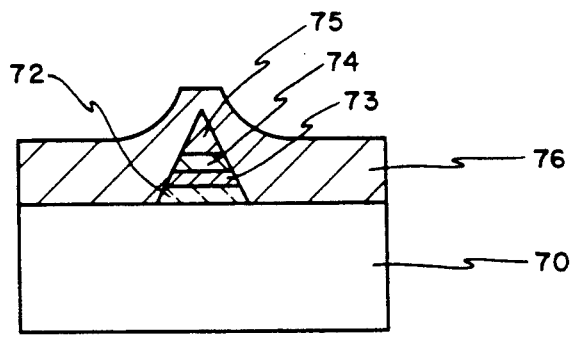
Figure 5C:
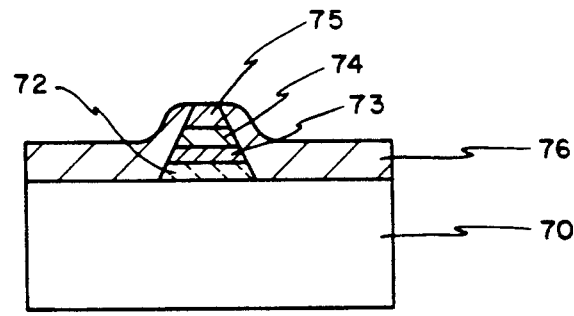
Figure 5D:
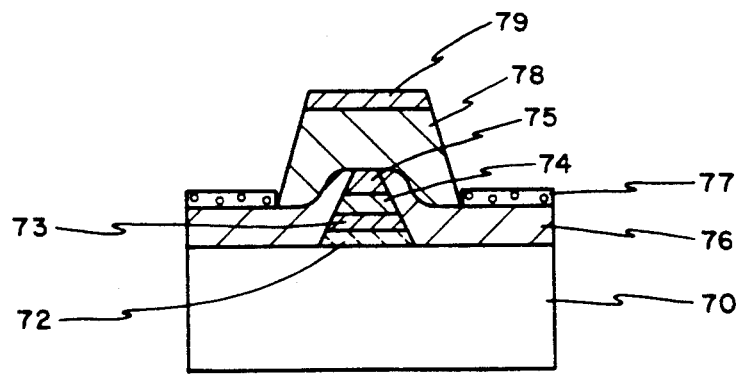

Besides in the second embodiment described above, the process of forming the compensating contact layer 76 which covers the summed surface of the surface of the substrate 70 and the sides of the active layer (FIG. 5(b)) is followed by the process of removing the top portion of the multilayer ridge (FIG. 5(c)). An alternative process can be used which comprises forming a $SiO_2$ mask 80 to cover the whole surface of layer 76, opening in this mask a stripe window of 2 μm wide just above the multilayer ridge, and then selectively diffusing Zn through the window to form an inverted to p-type region 81 reaching the layer 75 (FIG. 7(a)). In this case after enlarging the width of window of mask 80 to 6 μm following Zn diffusion step, the cladding layer 78 and the cap layer 79 are formed on the surface of the compensating contact layer 76 exposed through mask 80 (FIG. 7(b)). The subsequent steps of forming anodes 86 and a common cathode 85 are as described above with reference to FIG. 6.

Figure 7A:
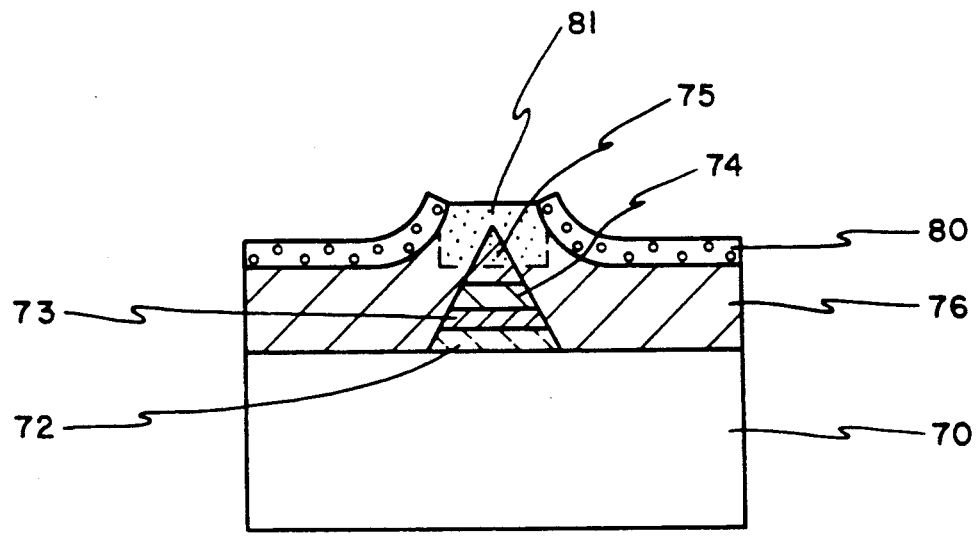
FIGS. 7a and 7b are sectional views correspondent to FIGS. 5(c) and 5(d), which illustrate in sequence the processing steps of a modified form of the second embodiment.
Figure 7B:
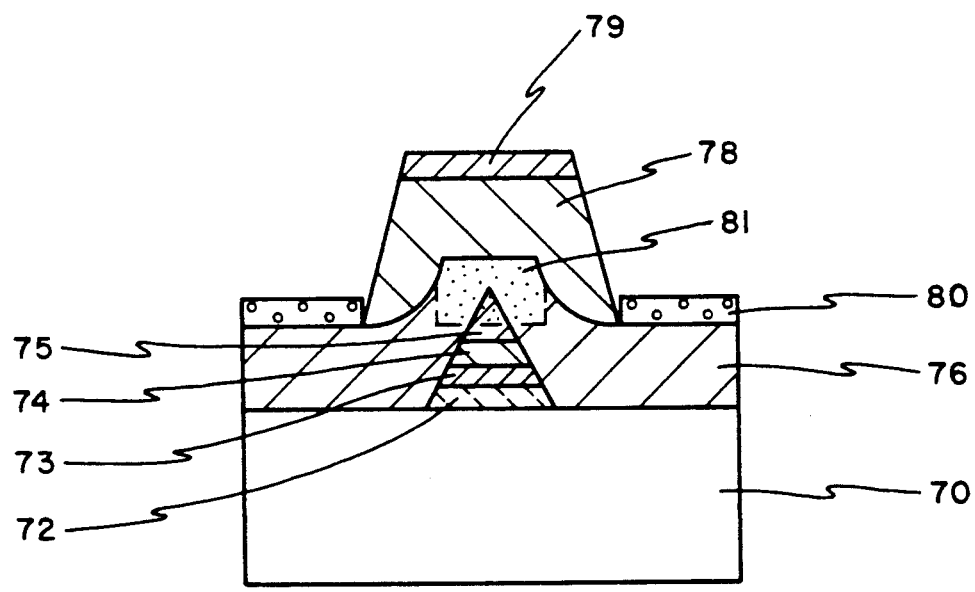

The tunable semiconductor lasers according to the second embodiment and the modified form thereof (FIGS. 7(a) and 7(b)) described above showed almost the same performance as that of the first embodiment and the modified form thereof. Under the condition of the laser light output power kept to be 10 mW or more, they showed the continuously adjustable range of oscillation wavelength to be about 70 Å while the first embodiment showed to be 85 Å as stated above.

As described above, the process of fabricating TTG tunable semiconductor lasers according to the present invention comprising a step of processing the semiconductor elements for defining the internal current path and/or optical waveguide, which is accomplished not by etching but by using selective MOVPE. This enables scattering of laser light in the active layer/quantum well structure and the tuning layer to be prevented, with the consequent increase of the efficiency of the drive current to laser light conversion, and in turn a reduced loss of coupling efficiency between an optical fiber and laser output light. Further effect of enabling smaller thickness from the active layer to the tuning layer produces the possibility to increase the laser oscillation tuning efficiency. The embodiments and modified forms described above are not deemed as limiting the technical scope of the present invention which shall be defined by the description of the appended claims.

What is claimed is:

1. A method of making a tunable twin guide semiconductor laser comprising: a step of preparing a semiconductor substrate provided at the surface thereof with a first semiconductor layer having a first conductivity type; a step of forming a diffraction grating on a surface of said first semiconductor layer; a step of forming a first mask on the surface of said first semiconductor layer, said first mask having a stripe-shaped window; a step of forming through said window a stripe-shaped multilayer ridge consisting of a tuning layer, a central layer having a second conductivity type, and an active layer by using selective epitaxy; a step of removing said first mask; a step of forming a second mask for preventing epitaxial growth on a surface of said multilayer ridge; a step of forming by epitaxy a compensating semiconductor layer having said second conductivity type on the surface of said multilayer ridge exposed through said second mask; and a step of forming a cladding layer on a surface of said active layer and a neighboring surface of said compensating semiconductor layer.

* * * * *